US008910355B2

(12) United States Patent
Adkisson et al.

(10) Patent No.: US 8,910,355 B2
(45) Date of Patent: Dec. 16, 2014

(54) METHOD OF MANUFACTURING A FILM BULK ACOUSTIC RESONATOR WITH A LOADING ELEMENT

(75) Inventors: James W. Adkisson, Jericho, VT (US); Panglijen Candra, Williston City, VT (US); Thomas J. Dunbar, Burlington, VT (US); Jeffrey P. Gambino, Westford, VT (US); Mark D. Jaffe, Shelburne, VT (US); Anthony K. Stamper, Williston, VT (US); Randy L. Wolf, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 128 days.

(21) Appl. No.: 13/323,285

(22) Filed: Dec. 12, 2011

(65) Prior Publication Data

US 2013/0147319 A1 Jun. 13, 2013

(51) Int. Cl.

| | |
|---|---|
| ***H03H 3/04*** | (2006.01) |
| ***H03H 9/15*** | (2006.01) |
| ***H03H 9/10*** | (2006.01) |
| ***H03H 3/02*** | (2006.01) |
| ***H03H 3/007*** | (2006.01) |
| *C23C 16/40* | (2006.01) |

(52) U.S. Cl.

CPC ............... *H03H 3/04* (2013.01); *H03H 9/1085* (2013.01); *H03H 9/1092* (2013.01); *H03H 9/105* (2013.01); *H03H 3/02* (2013.01); *C23C 16/402* (2013.01); *H03H 9/1007* (2013.01); *C23C 16/401* (2013.01); *H03H 3/007* (2013.01)

USPC ................ 29/25.35; 29/594; 29/830; 29/846; 310/312; 310/344; 333/188; 333/189

(58) Field of Classification Search

CPC ........... H03H 3/02; H03H 3/04; H03H 3/077; H03H 9/1007; H03H 9/1014; H03H 3/007; H03H 9/105; H03H 9/1085; H03H 9/1092; C23C 16/401; C23C 16/402; H04R 17/00

USPC ......... 29/25.35, 594, 846, 830; 333/188, 189; 310/313 R, 312, 320, 334, 344, 348; 438/778, 787

See application file for complete search history.

(56) References Cited

U.S. PATENT DOCUMENTS 4,379,244 A * 4/1983 Dinger ..................... 29/25.35 X
5,446,306 A 8/1995 Stokes et al.
6,051,907 A 4/2000 Ylilammi
6,469,597 B2 * 10/2002 Ruby et al. ............... 29/25.35 X (Continued)

FOREIGN PATENT DOCUMENTS

JP 06120416 A * 4/1994 ................... 29/25.35

OTHER PUBLICATIONS

Marksteiner, S. et al, "A Miniature BAW Duplexer using Flip-Chip on LTCC", IEEE Ultrasonics Symposium, 2003, pp. 1794-1797.

(Continued)

*Primary Examiner* — A. Dexter Tugbang

(74) *Attorney, Agent, or Firm* — Anthony Canale; Roberts Mlotkowski Safran & Cole, P.C.

(57) ABSTRACT

Manufacturing a semiconductor structure including modifying a frequency of a Film Bulk Acoustic Resonator (FBAR) device though a vent hole of a sealing layer surrounding the FBAR device.

19 Claims, 7 Drawing Sheets

95 95 90 60 65 110 105

95 80 95 90 60 t1 t2

(56) References Cited

U.S. PATENT DOCUMENTS

| | | | | |
|---|---|---|---|---|
| 6,476,536 | B1 | 11/2002 | Pensala | |
| 7,205,702 | B2 | 4/2007 | Ha et al. | |
| 7,294,588 | B2 * | 11/2007 | Karim et al. | 438/787 |
| 2004/0085159 | A1 * | 5/2004 | Kubena et al. | 333/188 |
| 2005/0088257 | A1 | 4/2005 | Ruby et al. | |
| 2005/0140247 | A1 * | 6/2005 | Lee | 310/320 |
| 2008/0034575 | A1 * | 2/2008 | Chang et al. | 29/594 |
| 2010/0201221 | A1 * | 8/2010 | Inoue et al. | 310/312 |

OTHER PUBLICATIONS

Mahon, S. et al., "Bulk Acoustic Wave Devices—Why, How, and Where They are Going", CS MANTHECH Conference, May 14-17, 2007, pp. 15-18.

H. Campanella Pineda "Thin-Film Bulk Acoustic Wave Resonators—FBAR", pp. 1-234, Dec. 2007, Ph.D Thesis Universite de Montpellier II (UM2) and Universitat Autonoma de Barcelona (UAB).

* cited by examiner

METHOD OF MANUFACTURING A FILM BULK ACOUSTIC RESONATOR WITH A LOADING ELEMENT

FIELD OF THE INVENTION

The invention relates to semiconductor structures and methods of manufacture and, more particularly, modifying a frequency of a Film Bulk Acoustic Resonator (FBAR) device by modifying a loading element of the FBAR device.

BACKGROUND

Thin Film Bulk Acoustic Resonator (FBAR or TFBAR) is a device including a piezoelectric material sandwiched between two electrodes and acoustically isolated from the surrounding medium. FBAR devices using piezoelectric films with thicknesses ranging from several micrometers down to tenths of micrometers resonate in the frequency range of roughly 100 MHz to 10 GHz. Aluminum nitride and Zinc oxide are two common piezoelectric materials used in FBARs.

FBAR devices, including Bulk Acoustic Wave (BAW) filters, may be formed and subsequently attached to a substrate or circuit board using, e.g., flip chip techniques. Alternatively, FBAR devices, including BAW filters, may be incorporated into an integrated circuit (IC) chip at the wafer level, e.g., during CMOS (complementary metal oxide semiconductor) processing. The latter approach, i.e., forming FBAR devices at the wafer level during CMOS processing, eliminates the need for additional chips. However, tuning FBAR devices at the wafer level during CMOS processing is difficult due at least in part to the fabrication scale on monolithic devices.

Accordingly, there exists a need in the art to overcome the deficiencies and limitations described hereinabove.

SUMMARY

In a first aspect of the invention, a method of manufacturing a semiconductor structure includes modifying a frequency of a Film Bulk Acoustic Resonator (FBAR) device though a vent hole of a sealing layer surrounding the FBAR device.

In another aspect of the invention a method of forming a semiconductor structure includes forming an FBAR device comprising a bottom electrode, a top electrode, and a piezoelectric material therebetween. The method also includes forming a loading element on the top electrode. The method also includes changing a thickness of the loading element using a hole formed in a sealing layer encapsulating the FBAR device.

In yet another aspect of the invention, a semiconductor structure includes an FBAR device comprising a bottom electrode, a top electrode, and a piezoelectric material. The structure also includes a loading element on the top electrode, wherein the loading element comprises a modified thickness structured and arranged to tune a frequency of the FBAR device. The structure also includes a sealing layer encapsulating and defining a cavity around the FBAR device. The structure also includes a plugged vent hole in the sealing layer.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of an FBAR device, which comprises the structures of the present invention. In still further embodiments, a method in a computer-aided design system is provided for generating a functional design model of the FBAR device. The method comprises generating a functional representation of the structural elements of the FBAR device.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, modifying a frequency of a Film Bulk Acoustic Resonator (FBAR) device by modifying a loading element of the FBAR device. According to aspects of the invention, an FBAR device is formed at wafer level during CMOS processing, and the mass and/or geometry of a loading element of the FBAR device is modified to adjust a frequency of the FBAR device. In embodiments, material is added to or removed from the loading element through at least one vent hole in a sealing element, and the vent hole is plugged after modifying the loading element (e.g., tuning bar). In this manner, the frequency of the FBAR device may be adjusted at a relatively late stage in the CMOS manufacturing process.

Figure 1:
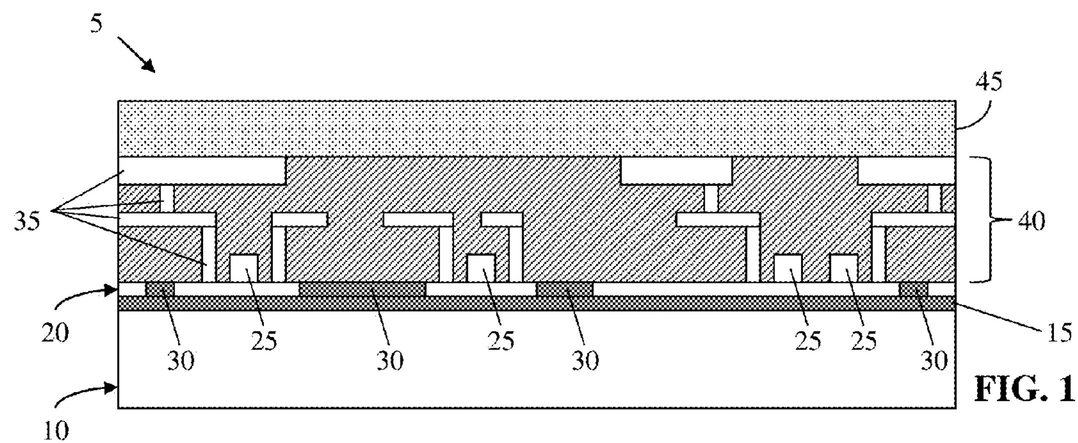
FIGS. 1-3, 4A, 4B, 5-7, 8A-B, and 9A-C show processing steps and structures in accordance with additional aspects of the invention.

FIGS. 1-3, 4A, 4B, 5-7, 8A-B, and 9A-C show processing steps and structures in accordance with additional aspects of the invention. In particular, FIG. 1 shows a cross section of a portion of a semiconductor structure 5 that has undergone CMOS processing. The semiconductor structure 5 may comprise a substrate 10. The substrate 10 may be composed of any suitable material or combination of materials, such as doped or undoped silicon, glass, etc. FIG. 1 shows a semiconductor-on-insulator (SOI) configuration in which an insulator layer 15 is formed on the substrate 10, and a semiconductor layer 20 is formed on the insulator layer 15. The insulator layer 15 and semiconductor layer 20 may be composed of any suitable materials, such as oxide and silicon, respectively. Devices 25 such as field effect transistors (FETs) may be formed on the semiconductor layer 20, and isolation regions 30 such as shallow trench isolation (STI) may be selectively arranged within the semiconductor layer 20. Although an SOI configuration is shown, it is understood that the devices 25 may equally be arranged on a non-SOI structure, such as a bulk material substrate, e.g., with appropriately doped regions typically referred to as wells. The substrate 10, insulator layer 15, semiconductor layer 20, devices 25, and isolation regions 30 may be formed using conventional semiconductor manufacturing processes and materials.

Still referring to FIG. 1, the semiconductor structure 5 may also comprise any number and arrangement of electrically conductive elements 35, such as wires, vias, and/or interconnects, formed in one or more interlevel dielectric (ILD) layers 40 over the semiconductor layer 20 and devices 25. As should be understood by those of ordinary skill in the art, the conductive elements 35 are structured and arranged to provide electrical communication with the one or more devices 25. The conductive elements 35 and ILD layers 40 may be formed using conventional semiconductor manufacturing processes and materials such as deposition of material, photolithography and etching process known to those of skill in the art.

In accordance with aspects of the invention, and as shown in FIG. 1, an insulator layer 45 is formed on the last wiring level of the semiconductor structure 5, e.g., directly on top of the uppermost portions of the conductive elements 35 and ILD layers 40. The insulator layer 45 may comprise $SiO_2$ or any other suitable insulator material, and may be formed using conventional processing techniques, such as chemical vapor deposition (CVD), oxidation, etc.

Figure 2:
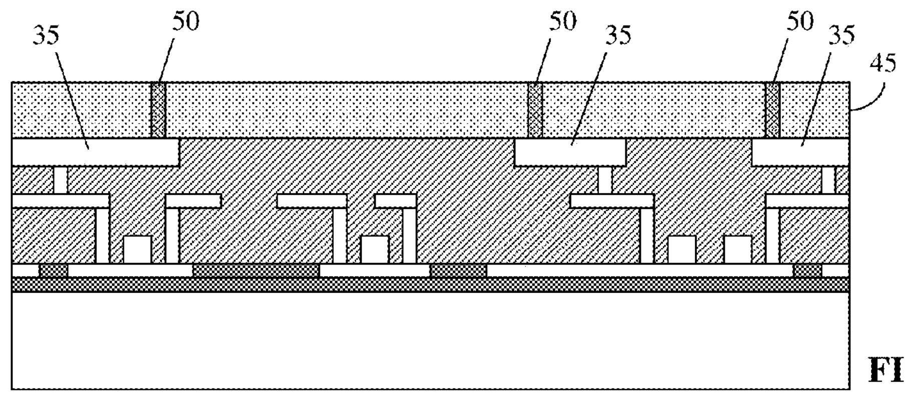

As shown in FIG. 2, electrical contacts 50 are formed in the insulator layer 45 and contacting conductive elements 35, such as interconnects. The contacts 50 may be any suitable electrically conductive material including, but not limited to, tungsten (W). The contacts 50 may be formed using conventional processing techniques, such as masking the insulator layer 45, etching patterns in the insulator layer 45, filling the patterns with the electrically conductive material, and planarizing the top surface.

For example, as is understood by those of ordinary skill in the art, a photomask may provided by forming a layer of photoresist material on the insulator layer 45, exposing the photoresist material to a pattern of light, and developing the exposed photoresist material. An etching process, such as a reactive ion etch (RIE), may then be used to form patterns (e.g., openings) in the insulator layer 45 by removing portions of the insulator layer 45 that are not covered by the photomask. After etching, the photomask may be removed using a conventional ashing or stripping process. A deposition process, such as chemical vapor deposition (CVD) or atomic layer deposition (ALD), may then be used to fill the patterns (openings) with electrically conductive material including, e.g., tungsten (W). A planarization process, such as chemical mechanical polish (CMP), may be used to remove material from the top surface of the structure to form a substantially planar uppermost surface.

Figure 3:
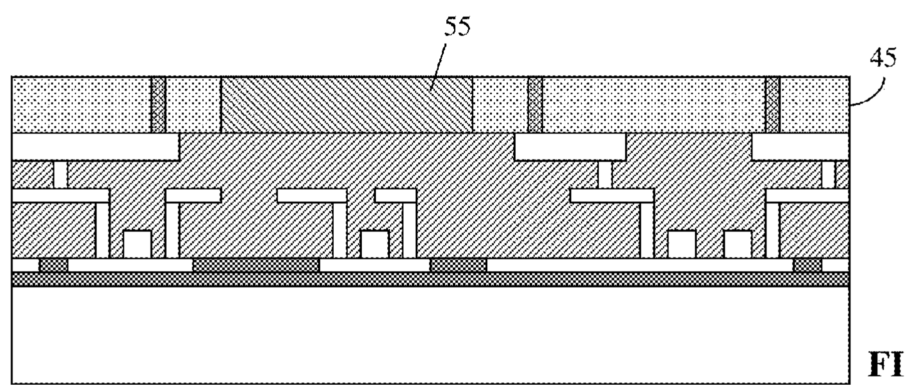

FIG. 3 shows the formation of a sacrificial material 55 in the insulator layer 45 in accordance with aspects of the invention. In embodiments, the sacrificial material 55 is composed of a polymer or silicon, although other suitable materials may be used within the scope of the invention. The sacrificial material 55 may be formed in the insulator layer 45 using conventional processing techniques, such as photolithographic masking and etching the insulator layer 45, and depositing silicon or applying polymer with a spin-on process. A CMP process may be applied after forming the sacrificial material 55 in the insulator layer 45.

Figure 4A:
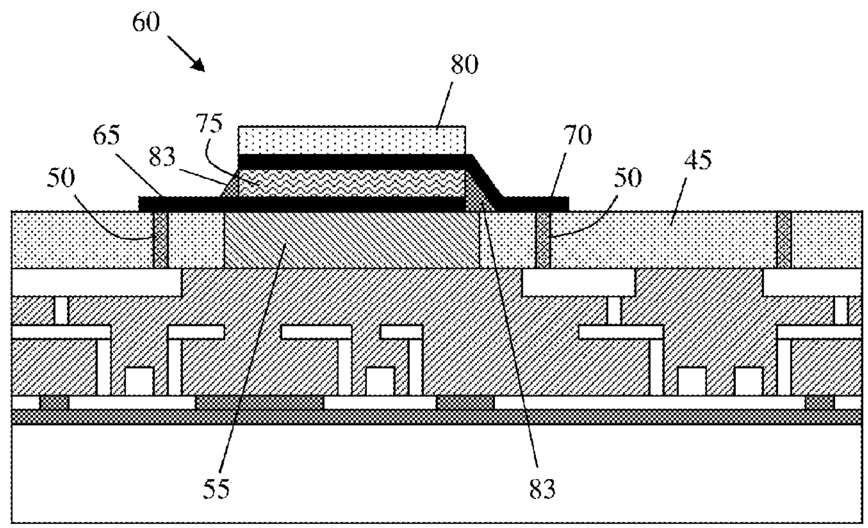

As shown in FIG. 4A, an FBAR device 60 is formed at least partially over the sacrificial material 55 and on portions of the insulator layer 45. In embodiments, the FBAR device 60 comprises a bottom electrode 65, top electrode 70, a piezoelectric material 75 sandwiched between the electrodes 65 and 70, and a loading element 80 on the top electrode 70. The FBAR device 60 may comprise, for example, a Bulk Acoustic Wave (BAW) filter, or any other desired FBAR device. The elements of the FBAR device 60 may comprise any suitable materials. For example, the bottom electrode 65 and top electrode 70 may each be composed of, for example, gold (Au), molybdenum (Mo), tungsten (W), copper (Cu), nickel (Ni), titanium (Ti), Niobium (Nb), silver (Ag), tantalum (Ta), cobalt (Co), or aluminum (Al). The piezoelectric material 75 may be composed of, for example, zinc oxide (ZnO), zinc sulfide (ZnS), aluminum nitride (AlN), lithium tantalate ($LiTaO_3$) or other members of the lead lanthanum zirconate titanate family.

The elements of the FBAR device 60 may be formed using conventional semiconductor processing techniques. For example, each element may be formed using a sputtering or deposition process to form a blanket (e.g., conformal layer) of material, and subsequent patterning of the material using masking and etching processes known to those of skill in the art.

The bottom electrode 65 and top electrode 70 may be formed in contact with two respective contacts 50. This places the FBAR device 60 in electrical communication with at least one of the devices 25.

The FBAR device 60 may optionally include angled (e.g., tapered) sidewall spacers 83 arranged on the sidewalls of the piezoelectric material 75. The sidewall spacers 83 may be composed of any suitable insulator material, such as polymer or nitride, and may be formed using conventional processing techniques. In embodiments, the sidewall spacers 83 are provided to improve the structural integrity of the top electrode 70 at the sidewalls of the piezoelectric material 75, e.g., by tapering the sharp vertical step otherwise present at the sidewalls of the piezoelectric material 75.

Still referring to FIG. 4A, the loading element 80 in accordance with aspects of the invention comprises a layer of material formed on the top electrode 70 and may be composed of any suitable material or combination of materials that is compatible with design considerations described herein. The loading element 80 may also be referred to as loading bar, tuning layer, or tuning bar. In embodiments of the present invention, the material of the loading element 80 is selected based on the material of the sacrificial material 55. For example, in one embodiment, the sacrificial material 55 comprises polymer and the loading element 80 comprises silicon (Si). In another embodiment, the sacrificial material 55 comprises silicon and the loading element 80 comprises something other than silicon, such as Ti, Ni, Cu, Co, or Pt. In this manner, the sacrificial material 55 may be selectively removed, described in detail herein, without removing the loading element 80.

In embodiments, the loading element 80 is formed using conventional semiconductor processing techniques, e.g., depositing a material of the loading element, and subsequently patterning the material using masking and etching. The size and shape of the loading element 80 may be selected to provide an intended resonant frequency for the FBAR device 60. For example, the mass and geometry of the loading element 80 affects the mechanical vibration of the FBAR device 60, and thus may be selected to tune the resonant frequency of the FBAR device 60. In embodiments, the loading element 80 covers the entire top surface of the top electrode 70, although any desired shape of loading element may be used within the scope of the present invention.

Figure 4B:
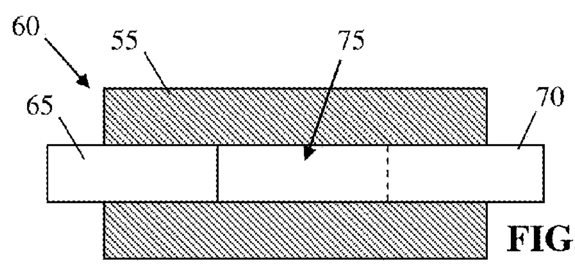

In accordance with aspects of the invention, the FBAR device 60 does not cover the entire sacrificial material 55. For example, as shown in FIG. 4B, which is a diagrammatic plan view of the FIG. 4A, the FBAR device 60 only covers a portion of the sacrificial material 55, with exposed portions of the sacrificial material 55 extending laterally beside the bottom electrode 65 and top electrode 70.

Figure 5:
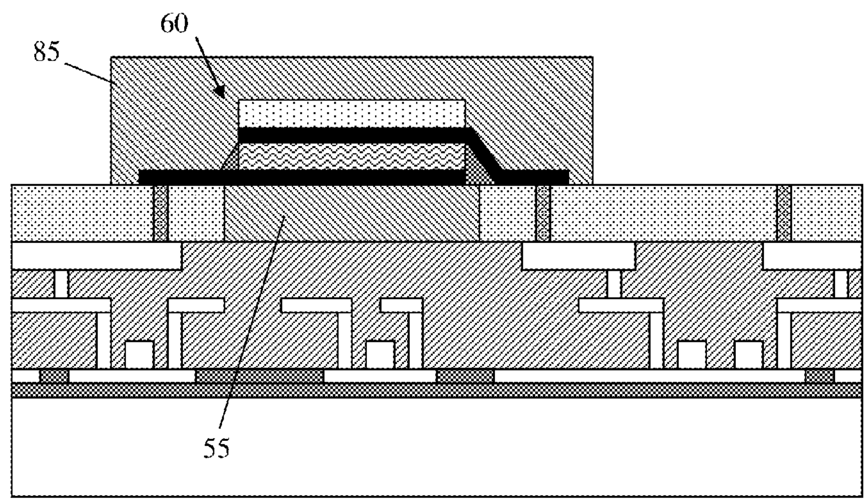

As shown in FIG. 5, a second layer 85 of sacrificial material is formed over the FBAR device 60 completely encapsulating the FBAR device 60. In embodiments, the second layer 85 of sacrificial material is composed of the same material as sacrificial material 55, e.g., polymer or silicon. The second layer 85 of sacrificial material may be formed using conventional semiconductor processing techniques, such as CVD, masking, and etching (e.g., for silicon) or masking and spin-on coating (e.g., for polymer). In embodiments, the second layer 85 of sacrificial material contacts at least a portion of the sacrificial material 55, e.g., laterally beside the FBAR device 60. The second layer 85 of sacrificial material 85 can also be formed in the manner described with reference to sacrificial material 55, e.g., patterning an insulator material and deposition of the second layer 85 of sacrificial material within the pattern.

Figure 6:
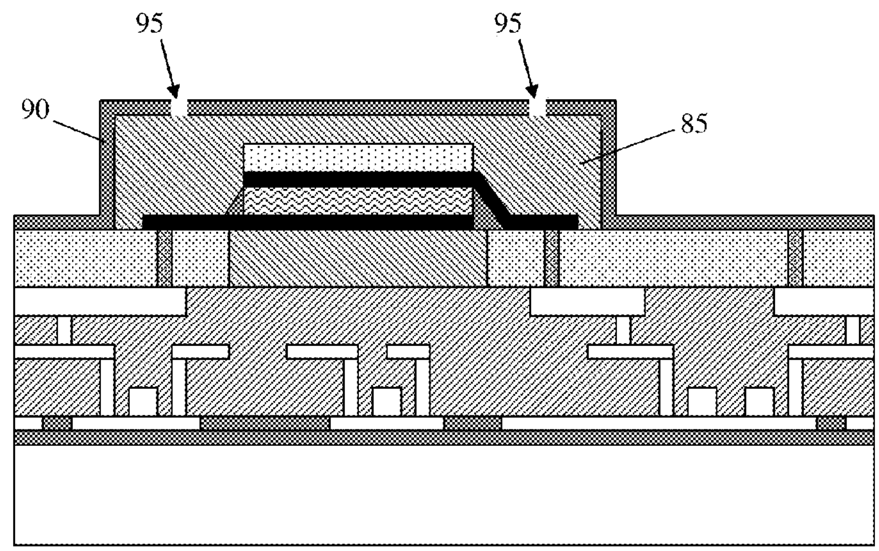

FIG. 6 shows the formation of a sealing layer 90 on the second layer 85 of sacrificial material in accordance with aspects of the invention. In embodiments, the sealing layer 90 comprises $SiO_2$ or SiN, although any suitable sealing material may be used within the scope of the invention. The sealing layer 90 may be formed using, e.g., CVD.

Also shown in FIG. 6, at least one vent hole 95 is formed in the sealing layer 90 to expose the underlying second layer 85 of sacrificial material. The vent hole 95 may be formed using conventional processing techniques, such as photolithographic masking and etching of the sealing layer 90. The size (e.g., width), shape, location, and/or number of vent holes 95 may be selected in accordance with design aspects described herein. In embodiments, the vent hole 95 may have a width of about 0.25 to 1.0 micros, although other dimensions may be used within the scope of the invention.

As should be understood by those of skill in the art, the width and height of the vent hole 95 determines the amount of material that should be deposited after removing the sacrificial materials to pinch off the vent hole 95. In general, the amount of material that should be deposited to pinch off the vent hole 95 decreases as the vent hole width decreases; and as the vent hole aspect ratio, which is the ratio of the vent hole height to width, increases. In embodiments, for example, the vent hole 95 is about 3 μm tall and 1 μm wide; although other dimensions are also contemplated by the present invention. In embodiments, the vent hole 95 may be circular or nearly circular, to minimize the amount of subsequent material needed to pinch it off.

Figure 7:
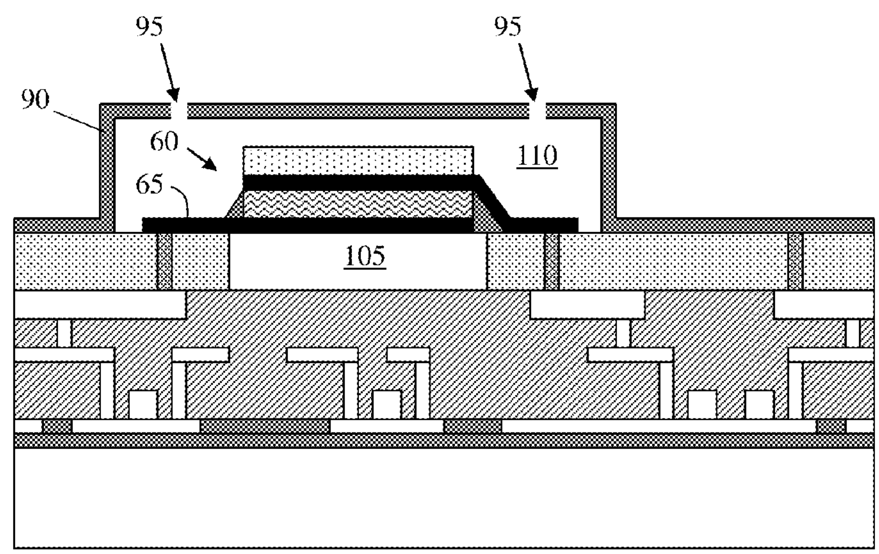

In accordance with aspects of the invention, and as shown in FIG. 7, the second layer 85 of sacrificial material and the sacrificial material 55 are removed by venting processes. In embodiments, the vent hole 95 is used for etching the second layer 85 of sacrificial material and the sacrificial material 55 through the sealing layer 90. For example, when the second layer 85 of sacrificial material and the sacrificial material 55 are both composed of a polymer material, the vent hole 95 may be used as an access point for an oxygen plasma etch that removes the second layer 85 of sacrificial material and the sacrificial material 55. As another example, when the second layer 85 of sacrificial material and the sacrificial material 55 are both composed of silicon, the vent hole 95 may be used as an access point for a fluorine based dry etch (e.g., $XeF_2$ etch) that removes the second layer 85 of sacrificial material and the sacrificial material 55.

Removal of the second layer 85 of sacrificial material and the sacrificial material 55 forms a lower cavity 105 and an upper cavity 110 around the FBAR device 60. In embodiments, the FBAR device 60 is structurally supported above the lower cavity 105 by the bottom electrode 65.

Figure 8A:
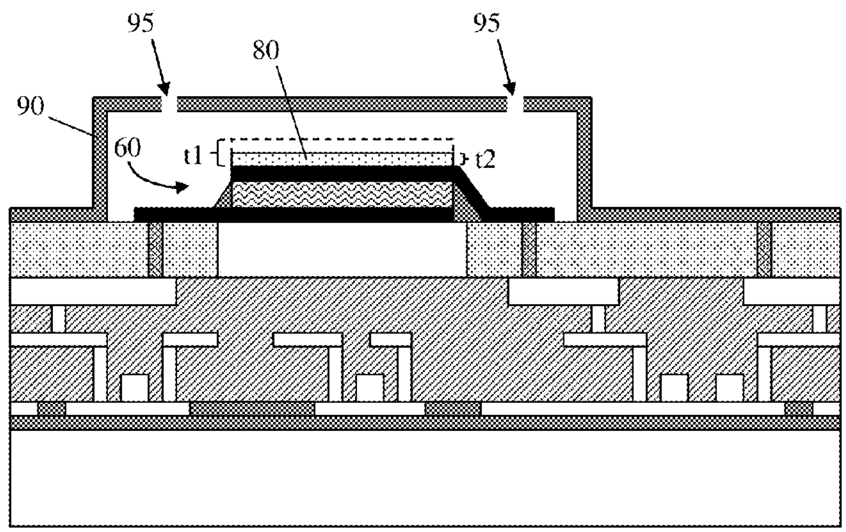
Figure 8B:
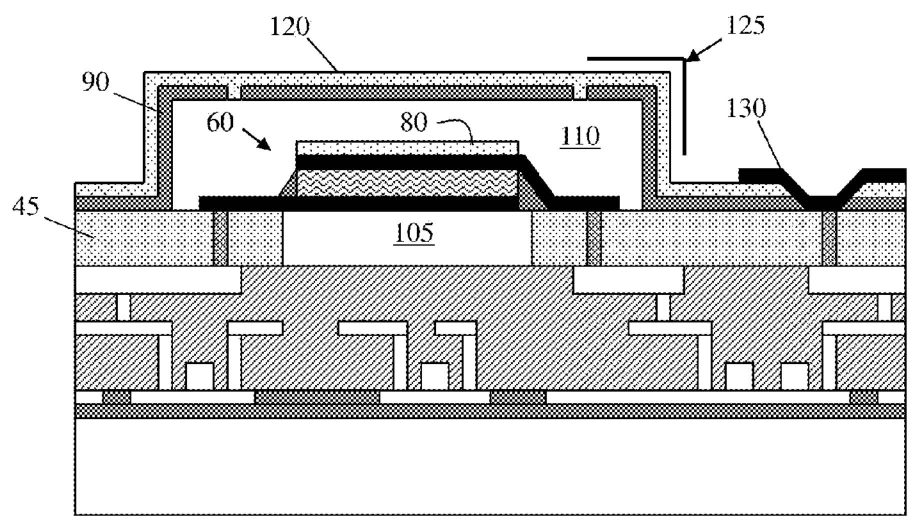

FIGS. 8A and 8B show steps of removing material from the loading element 80 and plugging the hole 95 in the sealing layer 90 in accordance with aspects of the invention. In embodiments, after forming the cavities 105 and 110 around the FBAR device 60, the actual frequency of the FBAR device 60 is determined and compared to a target (e.g., design) frequency. When the actual frequency is lower than the target frequency, material may be removed from the loading element 80 in order to raise the actual frequency. In this manner, the actual frequency may be tuned to more closely match the target frequency. The actual and target frequencies may be resonant frequencies of the FBAR device 60.

In embodiments, when the loading element 80 is composed of Si, W, or Ge, material may be removed from the loading element 80 using an $XeF_2$ etch through the vent hole 95. Additionally or alternatively, material may be removed from the loading element 80 using laser ablation and/or gas cluster ion beam (GCIB) processes.

As shown in FIG. 8A, the loading element 80 has a first thickness t1 prior to the material removal and a second thickness t2 after the material removal. The amount of material removed from the loading element 80 can be selectively determined based on the desired amount of change in frequency of the FBAR device 60, and can be controlled during the material removal process, e.g., by controlling the time of the etching process.

FIG. 8B shows the formation of a second sealing layer 120 in accordance with aspects of the invention. In embodiments, the second sealing layer 120 is formed on the sealing layer 90 and inside hole 95. The second sealing layer 120 plugs the hole 95, such that the FBAR device 60 is sealed within the combination of the insulator layer 45, sealing layer 90, and second sealing layer 120.

Still referring to FIG. 8B, an optional layer 125 can also be deposited to provide a hermetic seal such as, for example, a 500 nm PECVD silicon nitride film or other films that provide a hermetic seal over material 120. Also, back end of the line processing, such as the addition of bond pads 130 may be performed using conventional processing techniques.

Figure 9A:
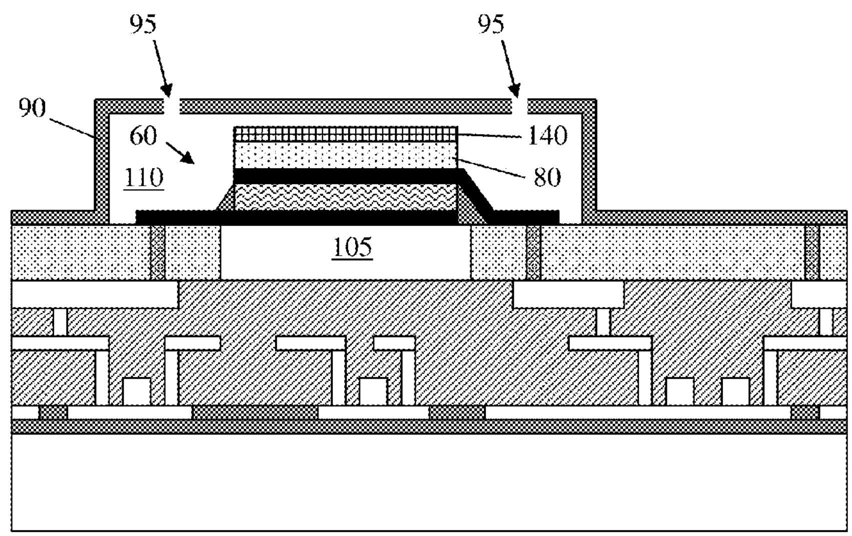
Figure 9B:
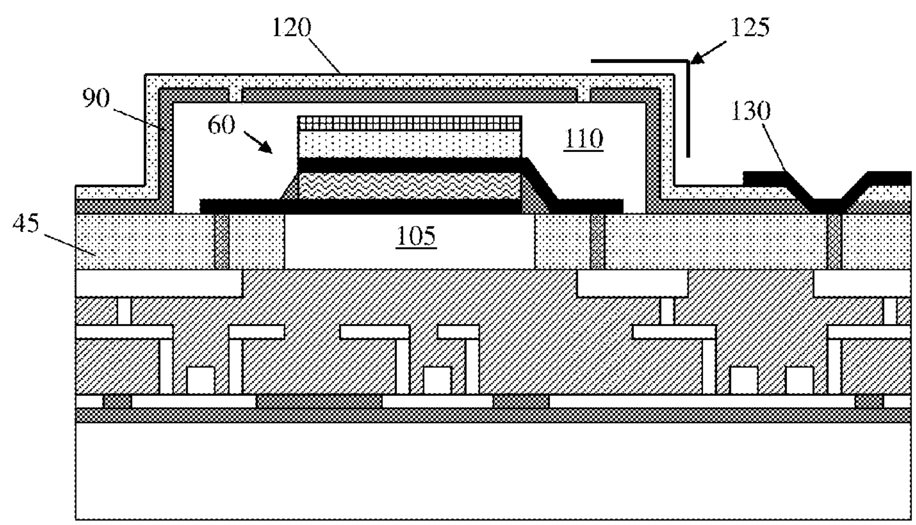

FIGS. 9A and 9B show steps of adding material to the loading element 80 and plugging the hole 95 in the sealing layer 90 in accordance with aspects of the invention. In embodiments, after forming the cavities 105 and 110 around the FBAR device 60, the actual frequency of the FBAR device 60 is determined and compared to a target (e.g., design) frequency. When the actual frequency is higher than the target frequency, additional material (e.g., represented by reference number 140) may be added from the loading element 80 in order to lower the actual frequency. In this manner, the actual frequency may be tuned to more closely match the target frequency.

In embodiments, the material adding step comprises adding a silicide or germanide material to the loading element 80. For example, when the loading element 80 is composed of Ti, Ni, Cu, Co, or Pt, the vent hole 95 may be used as an access point to flow $SiH_4$ or $GeH_4$ gas into the cavity 110, which forms an additional silicide or germanide material on the loading element 80.

In embodiments, the material adding step comprises a selective deposition (e.g., CVD or PECVD) of Si, Ge, or W on the loading element 80. For example, when the loading element 80 and/or the top surface of the top electrode 70 comprises Ta, the vent hole 95 may be used as an access point to flow one of $SiH_4$, $GeH_4$, or $WF_6$ gas into the cavity 110, which deposits Si, Ge, or W, respectively, on the loading element 80.

In other embodiments, material 140 may be added by laser induced oxidation of the loading element 80. Furthermore, the material 140 may be different than the material of the loading element 80, e.g., using processes such as SaCVD, PECVD TeoS, and PECVD silane. Moreover, the size, shape and/or location of the vent hole 95 may be selected to affect (e.g., control) the amount of material 140 added to the loading element 80. For example, the vent hole 95 may be located directly over the loading element 80 so that material 140 may be deposited directly onto the loading element 80.

FIG. 9B shows the formation of a sealing layer 120 in accordance with aspects of the invention. This may be performed as described above with respect to FIG. 8B. Also, an optional hermetic sealing layer 125 and other back end of the line elements, e.g., bond pads 130, may be provided as described with respect to FIG. 8B.

Figure 9C:
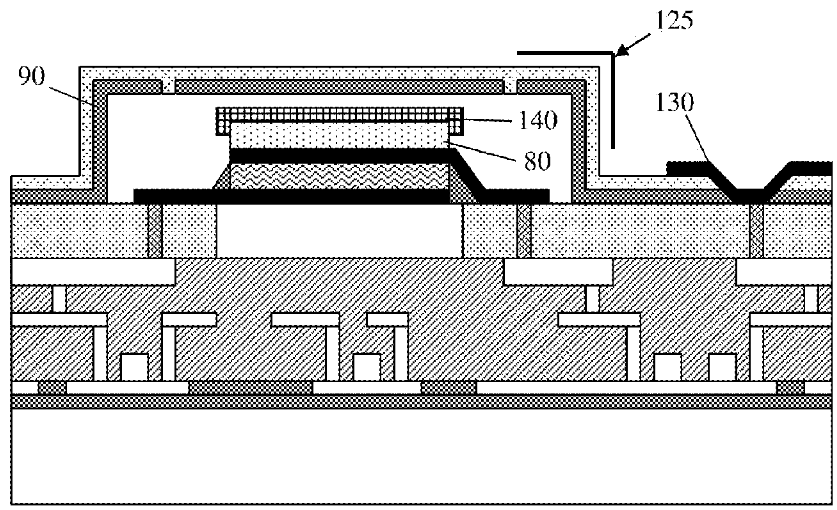

The amount of additional material 140 added to the loading element 80 can be selectively determined based on the desired amount of change in frequency of the FBAR device 60, and can be controlled during the material addition process, e.g., by controlling the duration of the CVD process. Moreover, the location of the added material 140 may be controlled by the location of the vent hole 95. For example, as shown in FIG. 9C, the added material 140 can cover the entire top surface of the loading element 80, and may optionally overhang the sides of the loading element 80.

According to aspects of the invention, tuning the FBAR device 60 (e.g., adding or removing material as described with respect to FIGS. 8A and 9A) is performed after the formation of the sealing layer 90 and cavities 105 and 110. This is because forming the sealing layer 90 and cavities 105 and 110 may affect (e.g., alter) the frequency characteristics of the FBAR device 60. If the FBAR device 60 were tuned prior to forming the sealing layer 90 and cavities 105 and 110, then the subsequent formation of the sealing layer 90 and cavities 105 and 110 may alter the vibration characteristics of the FBAR device 60 to a sufficient extent to cause the actual frequency to be moved further away from the target frequency. Implementations of the invention avoid this effect by tuning the FBAR device 60 after forming the sealing layer 90 and cavities 105 and 110.

Figure 10:
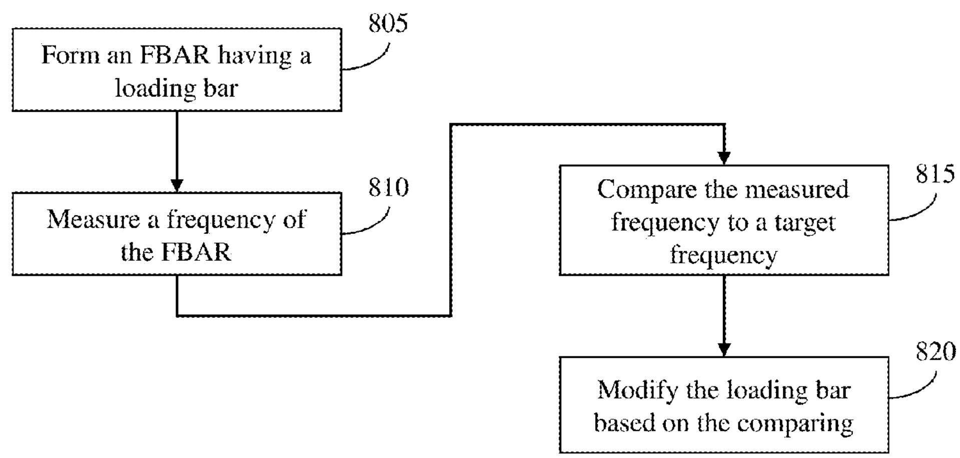
FIG. 10 is a flow diagram of a process in accordance with aspects of the invention.

FIG. 10 is a flow diagram of a process in accordance with aspects of the invention. At step 805, an FBAR device (e.g., FBAR device 60) having a loading bar (e.g., loading element 80) is formed. This may be performed in the manner described above with respect to FIGS. 1-4B. At step 810, the resonant frequency of the FBAR device is measured. For example, a signal may be applied to the FBAR device and a probe may measure the resulting frequency response (e.g., actual frequency) of the FBAR device. At step 815, the actual frequency (e.g., from step 810) is compared to a target (e.g., design) frequency. At step 820, the loading bar is modified based on the comparison from step 815. For example, when the actual frequency is lower than the target frequency, material may be removed from the loading bar in the manner described above with respect to FIG. 8A. On the other hand, when the actual frequency is higher than the target frequency, material may be added to the loading bar in the manner described above with respect to FIG. 9A. In this manner, the thickness of the loading bar is modified (e.g., increased or decreased) based on the comparison to provide an actual frequency that is closer to the target frequency. In embodiments, step 810 is performed after the FBAR device is encapsulated, e.g., after forming a sealing layer and cavities around the FBAR device.

In further embodiments, a send-ahead wafer of a particular production lot may be used to determine how to process a plurality of wafers in the lot. For example, plural wafers each including plural FBAR devices may be manufactured as described at step 805. One or more of the wafers may be designated as a send-ahead wafer that undergoes processing based on steps 810, 815, and 820, e.g., to determine a modification to the loading bar to tune the FBAR. Then, FBAR devices in the other wafers are modified in the same manner as the FBAR device of the send ahead wafer, but without undergoing the measuring and comparing (e.g., skipping steps 810 and 815). Moreover, sub-groupings of FBARS within one or more wafers may be provided with different numbers and or sizes of vent holes (e.g., vent hole 95). This option may be utilized without the send-ahead wafer process, e.g., by processing the production lot having a plurality of wafers with sub-groupings of FBARS without a send-ahead wafer, and then selecting IC chips based on the FBARS that have a measured frequency about equal to the target frequency.

Figure 11:
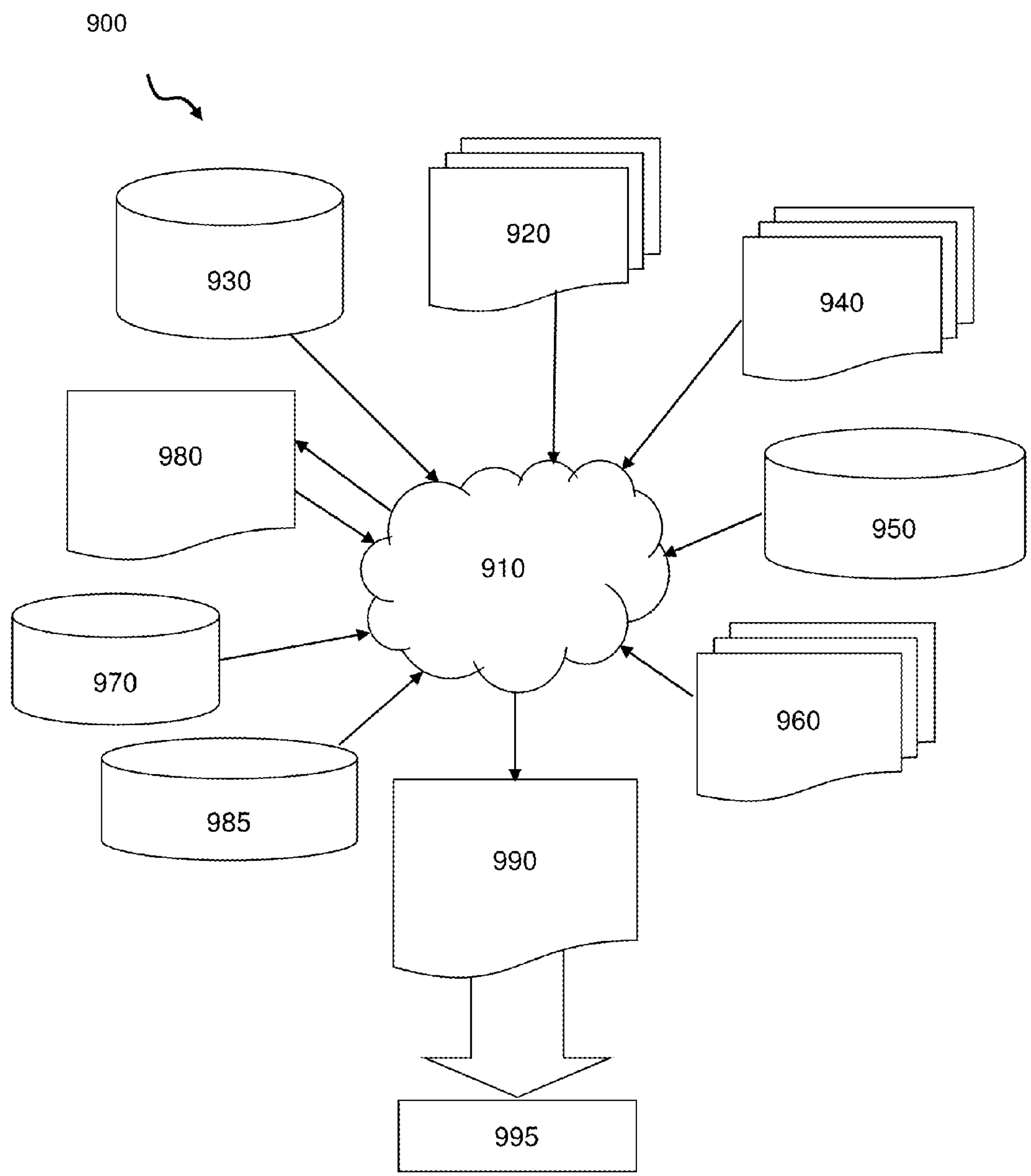
FIG. 11 is a flow diagram of a design process used in semiconductor design, manufacture, and/or test.

FIG. 11 is a flow diagram of a design process used in semiconductor design, manufacture, and/or test. FIG. 11 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-3, 4A, 4B, 5-7, 8A-B, and 9A-C . The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-3, 4A, 4B, 5-7, 8A-B, and 9A-C. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-3, 4A, 4B, 5-7, 8A-B, and 9A-C to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-3, 4A, 4B, 5-7, 8A-B, and 9A-C . In one embodiment, design structure 990 may comprise a compiled, executable HDL simulation model that functionally simulates the devices shown in FIGS. 1-3, 4A, 4B, 5-7, 8A-B, and 9A-C .

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-3, 4A, 4B, 5-7, 8A-B, and 9A-C . Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The corresponding structures, materials, acts, and equivalents of all means or step plus function elements in the claims, if applicable, are intended to include any structure, material, or act for performing the function in combination with other claimed elements as specifically claimed. Moreover, while the invention has been described in terms of embodiments, those of ordinary skill in the art will recognize that the invention can be practiced with modifications and in the spirit and scope of the appended claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein

What is claimed:

1. A method of manufacturing a semiconductor structure, comprising:

forming a bottom electrode of a Film Bulk Acoustic Resonator (FBAR) device on a first sacrificial material and an insulator layer;

forming a piezoelectric material on the bottom electrode;

forming a top electrode of the FBAR device on the piezoelectric material;

forming a loading element on the top electrode;

forming a second sacrificial material on and surrounding the FBAR device;

forming a sealing layer on the insulator layer and the second sacrificial material;

forming a vent hole in the sealing layer;

selectively removing the first sacrificial material and the second sacrificial material using an etch process through the vent hole, without removing the loading element; and modifying a frequency of the FBAR device through the vent hole of the sealing layer surrounding the FBAR device, wherein the modifying a frequency is performed after the forming the sealing layer and after the selectively removing the first sacrificial material and the second sacrificial material.

2. The method of claim 1, wherein the modifying the frequency comprises changing a thickness of a loading element of the FBAR device.

3. The method of claim 2, wherein the loading element comprises a tuning layer on the top electrode of the FBAR device.

4. The method of claim 2, wherein the changing the thickness of the loading element comprises removing material from the loading element by etching the loading element through the vent hole.

5. The method of claim 4, wherein the etching comprises a fluorine based dry etch.

6. The method of claim 1, further comprising:

measuring the frequency of the FBAR device;

comparing the frequency to a target frequency of the FBAR device; and performing the modifying of the frequency based on the comparing to provide a modified frequency, wherein a difference between the modified frequency and the target frequency is less than a difference between the frequency and the target frequency.

7. The method of claim 6, wherein the FBAR device is formed on a send-ahead wafer as part of a production lot of a plurality of wafers, and further comprising modifying frequencies of other FBAR devices formed on other ones of the plurality of wafers based on the measuring and the comparing.

8. The method of claim 1, further comprising filling the vent hole after the modifying the frequency.

9. The method of claim 1, wherein:

the first sacrificial material and the second sacrificial material are composed of a same material; and the loading element is composed of a material different than the first sacrificial material and the second sacrificial material.

10. The method of claim 1, further comprising forming a second sealing layer on top and side surfaces of the sealing layer and in the vent hole after the modifying the frequency, wherein the second sealing layer plugs the vent hole.

11. The method of claim 1, further comprising forming tapered sidewall spacers on sidewalls of the piezoelectric material.

12. The method of claim 1, further comprising:

forming the insulator layer on one or more interlevel dielectric layers over a substrate;

forming a transistor in an active layer of the substrate; and electrically connecting the transistor to the bottom electrode using electrically conductive elements in the one or more interlevel dielectric layers and an electrical contact in the insulator layer.

13. The method of claim 1, wherein the modifying the frequency comprises adding material to the loading element using a chemical vapor deposition (CVD) process, and further comprising:

measuring the frequency of the FBAR device after the forming the sealing layer and after the selectively removing the first sacrificial material and the second sacrificial material;

comparing the frequency to a target frequency of the FBAR device; and determining an amount of material to be added to the loading element and controlling a duration of the CVD process based on the comparing.

14. The method of claim 1, wherein:

the modifying the frequency comprises adding material to the loading element; and the added material covers an entire tope surface of the loading element and overhangs sides of the loading element.

15. A method of manufacturing a semiconductor structure, comprising:

modifying a frequency of a Film Bulk Acoustic Resonator (FBAR) device through a vent hole of a sealing layer surrounding the FBAR device, wherein the modifying the frequency comprises changing a thickness of a loading element of the FBAR device; and the changing of the thickness of the loading element comprises adding material to the loading element through the vent hole.

16. The method of claim 15, wherein the adding material comprises forming a silicide or a germanide on the loading element by flowing $SiH_4$ or $GeH_4$ through the vent hole.

17. The method of claim 15, wherein the adding material comprises selectively depositing Si, Ge, or W on the loading element by flowing $SiH_4$ , $GeH_4$ , or $WF_6$ through the vent hole.

18. The method of claim 15, wherein:

the loading element is composed of Ti, Ni, Cu, Co, or Pt; and the adding material comprises selectively forming germanide material on the loading element by flowing $GeH_4$ through the vent hole.

19. The method of claim 15, wherein:

the loading element is composed of Ta; and the adding material comprises selectively depositing Ge or W on the loading element by flowing $GeH_4$ or $WF_6$ through the vent hole.

* * * * *